United States Patent
Yasuho et al.

(10) Patent No.: US 6,303,989 B1
(45) Date of Patent: Oct. 16, 2001

(54) INTEGRATED CIRCUIT DEVICE ON METAL BOARD WITH CPU POWER CONVERTER

(75) Inventors: Takeo Yasuho, Neyagawa; Masao Iwata, Hirakata; Ryoichi Katsuragawa, Kouriyama; Hayami Matsunaga, Hirakata; Yoshikazu Suehiro, Ikoma; Yasuhiko Yokota, Hirakata, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 773 days.

(21) Appl. No.: 08/596,343

(22) PCT Filed: Jul. 30, 1995

(86) PCT No.: PCT/JP95/01326

§ 371 Date: Feb. 16, 1996

§ 102(e) Date: Feb. 16, 1996

(87) PCT Pub. No.: WO96/01498

PCT Pub. Date: Jan. 18, 1996

(30) Foreign Application Priority Data

Jul. 4, 1994 (JP) .................................................. 6-152177

(51) Int. Cl.$^7$ ............................. H01L 23/34; H05K 7/20; H05K 7/04
(52) U.S. Cl. .......................... 257/706; 257/724; 257/725; 361/719; 361/783; 361/803
(58) Field of Search ................................... 257/723, 724, 257/725, 699, 706

(56) References Cited

U.S. PATENT DOCUMENTS

| | | |
|---|---|---|
| 4,120,041 | 10/1978 | Hayakawa et al. . |
| 5,222,014 | * 6/1993 | Lin ........................................ 257/723 |
| 5,266,912 | 11/1993 | Kledzik . |
| 5,426,263 | 6/1995 | Potter et al. . |
| 5,466,969 | * 11/1995 | Tsunoda ............................... 257/706 |
| 5,469,330 | * 11/1995 | Karabatsos et al. ................. 257/706 |

FOREIGN PATENT DOCUMENTS

| | | | |
|---|---|---|---|
| 2264389 | * 8/1993 | (GB) | ..................... 257/699 |
| 4-87361A | 3/1992 | (JP) . | |
| 5-48000 | * 2/1993 | (JP) | ..................... 257/723 |
| 5-102390 | * 4/1993 | (JP) | ..................... 257/707 |
| 6-151702A | 5/1994 | (JP) . | |

* cited by examiner

*Primary Examiner*—Olik Chaudhuri
*Assistant Examiner*—Nathan Ha

(57) ABSTRACT

The present invention relates to integrated circuit devices for use in such civilian equipments as an electronic equipment, electrical equipment, communication equipment and measuring and controlling equipment, and its object is to provide an integrated circuit device which has an excellent heat radiating characteristic. Then, in order to achieve this object, it includes, on a metal board 1, a power supply 4 and a plurality of pin terminals 5 and includes, on a multi-layer circuit wiring board 7, mounted component parts comprising a cache controller 10, a cache memory section 11, a data buffer LSI section 14, a CPU chip 8 and a connector 12; and, by mounting a reverse surface of the multi-layer circuit wiring board 7 having the mounted component parts provided thereon on the metal board 1 having the power supply 4 provided thereon through the pin terminal group 5, it is possible to provide an integrated circuit device in which the degree of integration is enhanced and the heat radiating characteristic of heat generating component parts is excellent.

15 Claims, 4 Drawing Sheets

INTEGRATED CIRCUIT DEVICE ON METAL BOARD WITH CPU POWER CONVERTER

FIELD OF THE INVENTION

The present invention relates to integrated circuit devices for use in such civilian equipments as an electronic equipment, electrical equipment, communication equipment and measuring and controlling equipment.

BACKGROUND OF THE INVENTION

In the following, a description will be given with respect to a conventional integrated circuit device.

A conventional integrated circuit device has its component parts consisting of a power supply, CPU chip, cache controller, cache memory, data buffer LSI and connector mounted on a single, one or two-sided multi-layer circuit wiring board (motherboard), while electrically connecting respectively to desired component parts, and it includes heat radiating plates for individually radiating heat of the component parts and is provided with a cooling fan facing the heat radiating plates.

In the construction of the above-described conventional integrated circuit device, since the component parts are mounted on a single multi-layer circuit wiring board and the heat radiating plates are provided for individually effecting heat radiation, there has been a problem that the area of the board is increased and a sufficient heat radiation cannot be effected without using a cooling fan.

To solve the above conventional problem, it is an object of the present invention to provide an integrated circuit device which is improved in the degree of integration and is excellent in heat radiating characteristic.

SUMMARY OF THE INVENTION

To solve this problem, an integrated circuit device of the present invention has a construction comprising: a metal board having a power supply; a multi-layer circuit wiring board having a plurality of pin terminals fitted therein and electrically connected to said power supply on the metal board; a CPU chip having TAB wiring electrically connected to said multi-layer circuit wiring board between said metal board and said multi-layer circuit wiring board; a cache memory section and data buffer LSI section electrically connected to said multi-layer circuit wiring board on a surface opposite to the CPU chip provided on said multi-layer circuit wiring board; and a connector electrically connected to said multi-layer circuit wiring board.

DESCRIPTION OF THE PREFERRED EMBODIMENTS(S)

(Embodiment 1)

In the following, a description will be given with respect to an integrated circuit device in an embodiment of the present invention with reference to the drawings.

Figure 1:
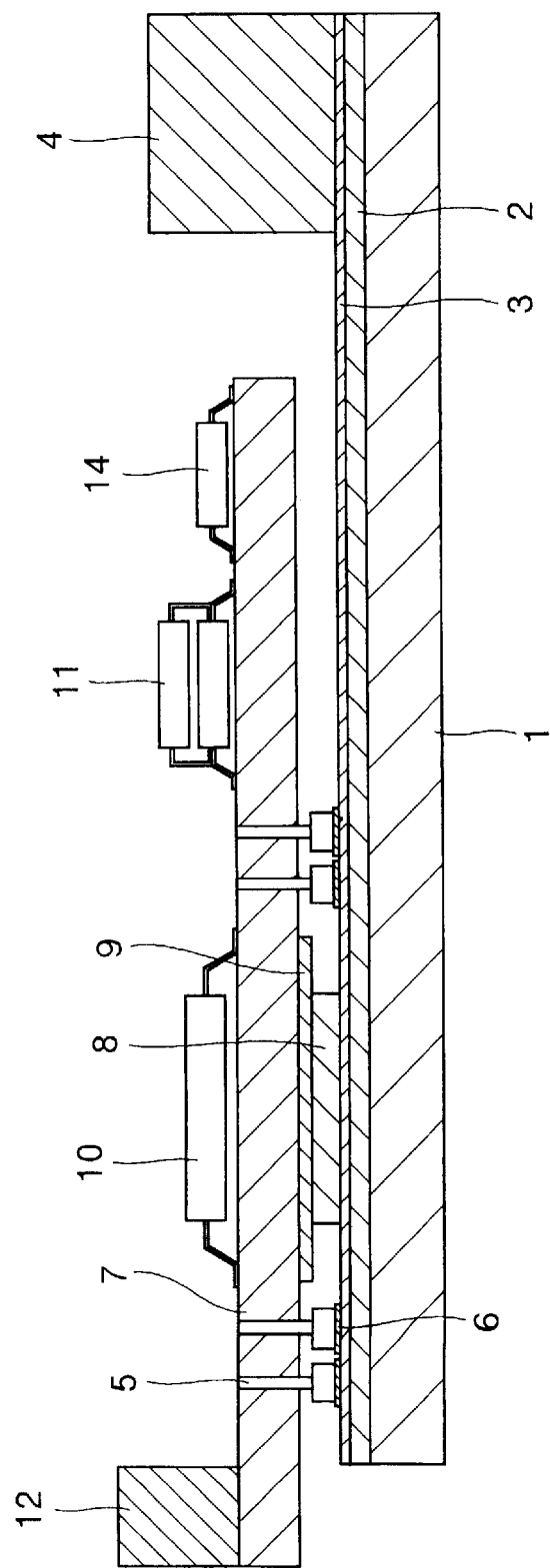
FIG. 1 is a sectional view of an integrated circuit device in an embodiment of the present invention.

FIG. 1 is a sectional view of an integrated circuit device in an embodiment of the present invention. Referring to FIG. 1, what is denoted by numeral "1" is a metal board consisting of an aluminum or silicon steel plate. "2" is an insulating layer including at least one of an epoxy resin and ceramic provided on one surface of the metal plate 1. "3" is a conductive layer such as a copper foil having a desired wiring pattern provided on an upper surface of the insulating layer 2 on the metal plate 1 having the insulating layer 2. "4" is a power supply such as DC/DC converter, AC/DC converter, etc., provided on an upper end surface of the conductive layer 3 and electrically connected to the conductive layer 3. "5" is a plurality of pin terminals substantially in the form of a cross metallically coupled to the conductive layer 3 through a high-temperature solder 6, forming a positive electrode terminal or negative electrode terminal electrically connected to the power supply 4 through the conductive layer 3. "7" is a multi-layer circuit wiring board provided as having the pin terminals 5 fitted therein, where a surface opposite to the surface facing the metal board 1 has at least a data bus, address bus, control bus, power line and grounding line (not shown) thereon, at least the power line and the ground line being electrically connected to the pin terminal 5. "8" is a CPU chip having a TAB wiring 9 and electrically connected to the multi-layer circuit wiring board 7, a surface of the CPU chip opposite to the multi-layer circuit wiring board 7 being secured to the conductive layer 3 on the metal board 1. "10" is a cache controller provided substantially on the upper surface of the CPU chip 8 in the surface of the multi-layer circuit wiring board 7 opposite to the CPU chip 8, being electrically connected to the CPU chip 8 through the multi-layer circuit wiring board 7. "11" is a cache memory section provided on the same surface as the cache controller 10 and electrically connected to the cache controller 10 through the multi-layer circuit wiring board 7. "14" is a data buffer LSI section provided on the same surface as the cache controller 10 and electrically connected to the cache controller 10, cache memory section 11 and CPU chip 8 through the multi-layer circuit wiring board 7. "12" is a connector provided on the same surface as the cache controller 10 and electrically connected to the cache controller 10.

With respect to the integrated circuit device in an embodiment of the present invention constructed as the above, its operation will be described below.

First, a voltage of 3.3 V is supplied from the power supply 4 to the CPU chip 8 through the pin terminal group 5.

Next, necessary data and instruction codes (hereinafter referred to as "command") are supplied by the cache controller 10 and data buffer LSI section 14 to the cache memory section 11 from a main memory (not shown) connected thereto through the connector 12, the CPU chip 8 performing various operational processing based on the data and commands in the cache memory section 11.

Finally, the data variously processed by the CPU chip 8 is transmitted to the cache controller 10 and cache memory section 11 from the multi-layer circuit wiring board 7 and is transmitted to the connector 12 through the multi-layer circuit wiring board 7 to be output to an externality.

Here, of the CPU chip 8 and power supply 4 which are heat generating components, heat is conducted and radiated through the metal board 1 to all the surfaces opposite to those on which the CPU chip 8 and power supply 4 are provided, thus being radiated from the metal board 1.

Note that a further improved heat radiating capability may be obtained by applying an insulating layer of an inorganic material such as a ceramic onto the surface of the metal board 1 facing the CPU chip 8.

(Embodiment 2)

A description will be given below with respect to another embodiment of the present invention with reference to the drawings.

Figure 2:
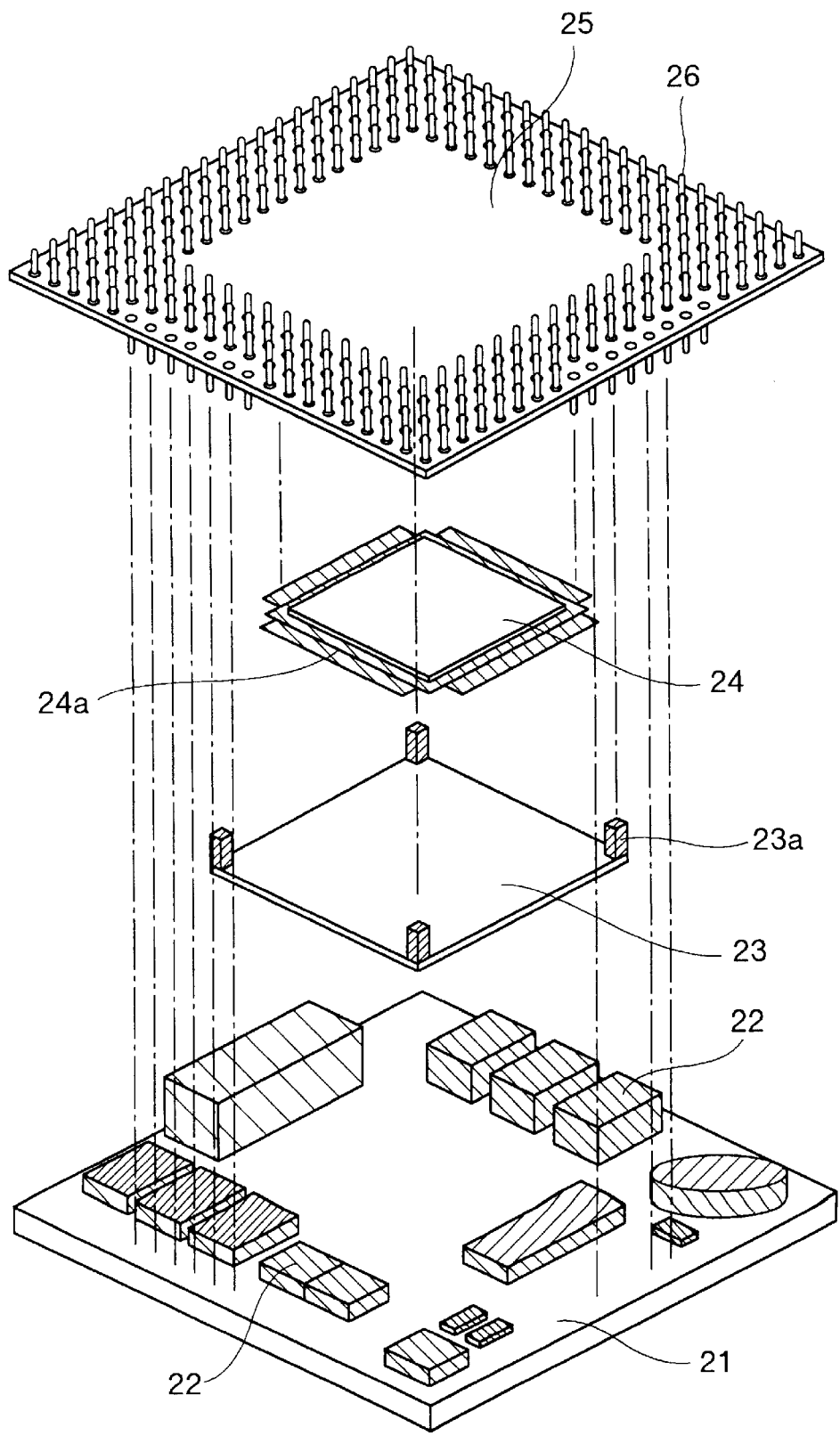
FIG. 2 is an exploded perspective view of an integrated circuit device in another embodiment of the present invention.
Figure 3:
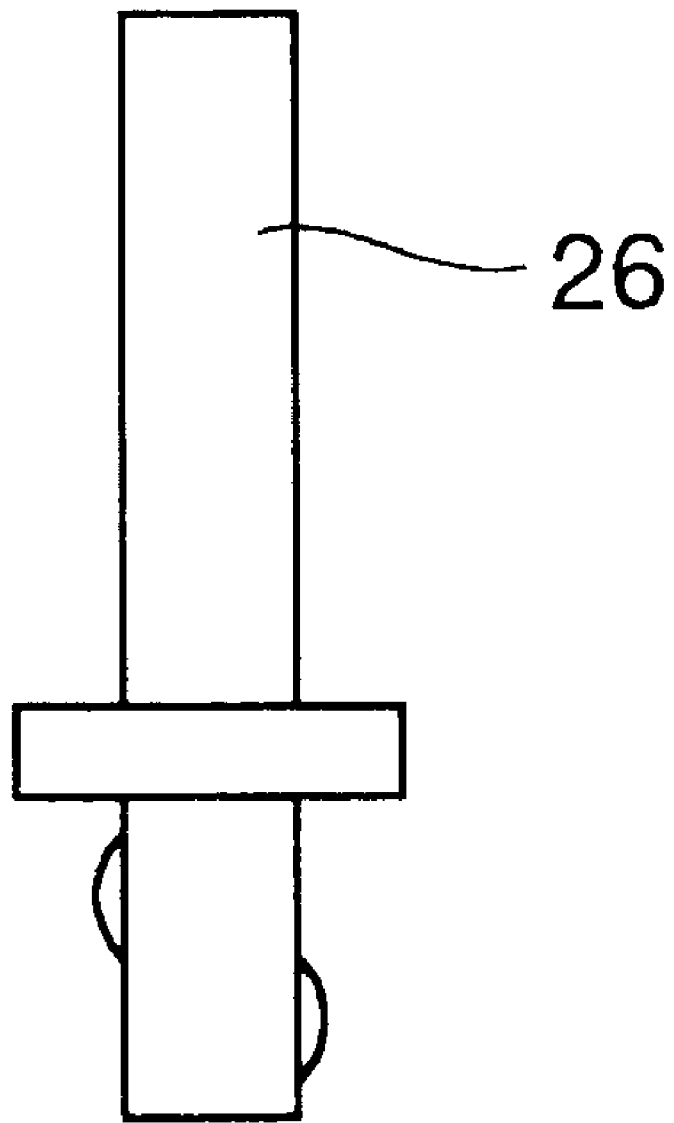
FIG. 3 is a sectional view of a pin showing an essential portion of the same.

FIG. 2 is an exploded perspective view of an integrated circuit device in another embodiment of the present invention. Referring to FIG. 2, what is denoted by numeral "21" is a metal board consisting of an aluminum or silicon steel plate, etc., having a wiring pattern (not shown) on an upper surface thereof and having, on side portions thereof, a power supply section 22 such as a DC/DC converter or AC/DC converter electrically connected to the wiring pattern. "23" is a protection plate consisting for example of copper or aluminum, coupled to a center portion of the metal board 21 with solder and having a plurality of pillars 23a at side end portions of a surface opposite to the connection with the metal board 21, protecting CPU chip 24 to be described later and radiating heat of the CPU chip 24. "24" is a CPU chip having a TAB wiring 24a, bonded by means of an Si-type or epoxy-type adhesive to the surface surrounded by the pillars 23a provided on the protection plate 23. "25" is a multi-layer circuit wiring board having a plurality of pins 26 substantially in the form of a cross as shown in FIG. 3 fitted into or coupled with solder to side portions thereof, the plurality of pins 26 and the metal board 21 being electrically connected to each other by a solder (not shown) coupling.

Figure 4:
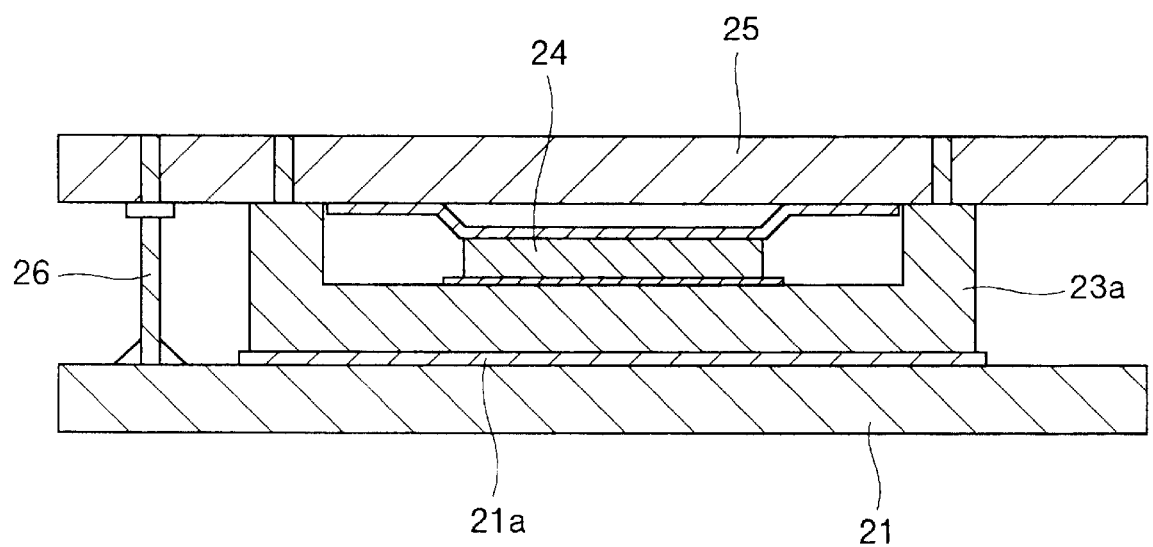
FIG. 4 is a sectional view of an essential portion of the same showing connection to each other among the metal board, a protection board, the CPU chip and the multi-layer circuit wiring board.

FIG. 4 is a sectional view showing the connection among the multi-layer circuit wiring board, protection plate and metal board which constitute a main portion. In the figure, the pin 26 is fitted into the metal board 21 and is electrically connected to a wiring pattern 21a on an upper surface of the metal board 21. Further, the protection plate 23 and the multi-layer circuit wiring board 25 are connected to each other by applying solder to the pillar 23a to achieve a solder coupling. Furthermore, the CPU chip 24 is electrically connected to an internal wiring (not shown) of the multi-layer circuit wiring board 25.

With respect to an integrated circuit device in an embodiment of the present invention constructed as the above, its operation will be described below.

First, a voltage of 3.3 V is supplied from the power supply section 22 to the CPU chip 24 through the pin terminal group 26.

Next, necessary data and commands are supplied to the CPU chip 24 from an externality through the terminals, the CPU chip 24 performing various operational processing based on the data and commands.

Finally, the data variously processed by the CPU chip 24 is transmitted to the terminals through the multi-layer circuit wiring board to be output to an externality.

Here, heat of the CPU chip 24 which is a heat generating component and of the power supply section 22, is conducted and radiated through the protection plate/metal board and through the metal board 21, to all the surfaces opposite to those on which the CPU chip 24 and power supply section 22 are provided, thus being radiated from the metal board 21.

Further, the CPU 24 which tends to be subjected to a breakdown by an external force through the metal board 21 may be protected by the protection plate 23.

Needless to say, the protection plate 23 and pillars 23a may be either provided monolithically or assembled with each other.

INDUSTRIAL APPLICABILITY

With respect to the industrial applicability of the integrated circuit device according to the present invention, the degree of integration is increased and the surface area of the metal board is wider by three-dimensionally disposing the multi-layer circuit wiring board and metal board through a plurality of pin terminals, making it possible to provide an integrated circuit device which is excellent in heat radiating characteristic of heat generating component parts such as the power supply and CPU chip.

Further, with a construction where a power supply is provided on a metal board or a construction where a plurality of pins are secured onto a metal board by a high-temperature solder, it is possible to provide an integrated circuit device capable of forming a conductive layer having a low impedance, since power may be supplied from a location close to the pin terminals.

Further, it is possible to provide an integrated circuit device having an even higher degree of integration by providing a CPU chip in a construction having a TAB wiring brought out from the CPU and electrically connected to the multi-layer circuit wiring board, or a construction where the CPU chip is secured by means of an adhesive to an upper surface of the metal board or to an upper surface of a conductive layer provided on the metal board through an insulating layer.

Furthermore, it is possible to provide an integrated circuit device which is very excellent in heat radiating characteristic by a construction where an insulating layer is applied to a reverse surface of the metal board on which a CPU chip is placed.

LIST OF REFERENCE NUMERALS IN DRAWINGS 1, 21 . . . metal board
2 . . . insulating layer
3 . . . conductive layer
4 . . . power supply
5, 26 . . . pin
6 . . . solder
7, 25 . . . multi-layer circuit wiring board
8, 24 . . . CPU chip
9, 24a . . . TAB wiring
10 . . . cache controller
11 . . . cache memory section
12 . . . connector
22 . . . power supply section
23 . . . protection plate
23a . . . pillar portion

What is claimed is:
1. An integrated circuit device comprising:
   a metal board having a CPU power converter which includes one of a DC/DC converter and an AC/DC converter for converting a supply voltage form a motherboard into a driving voltage for driving a CPU chip;
   a multi-layer circuit wiring board having a plurality of pin terminals fitted therein and electrically connected to said CPU power converter on the metal board;
   a CPU chip electrically connected to said multi-layer circuit wiring board between said metal board and said multi-layer circuit wiring board;
   a control section electrically connected to said multi-layer circuit wiring board on a surface opposite to the CPU chip provided on said multi-layer circuit wiring board; and a connector electrically connected to said multi-layer circuit wiring board.

2. An integrated circuit device comprising:

a metal board having a CPU power converter section on a side portion of an upper surface thereof, which power converter section includes one of a DC/DC converter and an AC/DC converter for converting a supply voltage from a motherboard into a driving voltage for driving a CPU chip;

a protection plate provided at a center portion of said metal board and having a plurality of pillars at side end portions thereof;

a CPU chip provided on a surface of the protection plate surrounded by the pillars; and a multi-layer circuit wiring board electrically connected to said metal board through a plurality of pins.

3. An integrated circuit device according to claim 1 wherein the metal board is formed by providing an insulating layer on a metal plate, a conductive layer being provided on said insulating layer of the metal board.

4. An integrated circuit device according to claim 1 wherein the CPU chip has a TAB wiring brought out from the CPU and is electrically connected to the multi-layer circuit wiring board.

5. An integrated circuit device according to claim 1 wherein the CPU chip is secured by means of an adhesive to an upper surface of the metal board or to an upper surface of a conductive layer provided on the metal board through an insulating layer.

6. An integrated circuit device according to claim 1 wherein the plurality of pins are secured onto the metal board with a high-temperature solder.

7. An integrated circuit device according to claim 1 wherein an insulating layer is applied to a reverse surface of the metal board having the CPU chip placed thereon.

8. An integrated circuit device according to claim 1 wherein the control section includes at least a cache controller, a cache memory section and a data buffer LSI section.

9. An integrated circuit device according to claim 2 wherein the protection plate and the pillars are formed integrally with each other or wherein the pillars are assembled with the protection plate.

10. An integrated circuit device according to claim 1 wherein the plurality of pins are substantially in the form of a cross.

11. An integrated circuit device according to claim 2 wherein the CPU chip has a TAB wiring brought out from the CPU and is electrically connected to the multi-layer circuit wiring board.

12. An integrated circuit device according to claim 2 wherein the CPU chip is secured by means of an adhesive to an upper surface of the metal board or to an upper surface of a conductive layer provided on the metal board through an insulating layer.

13. An integrated circuit device according to claim 2 wherein the plurality of pins are secured onto the metal board with a high-temperature solder.

14. An integrated circuit device according to claim 2 wherein an insulating layer is applied to a reverse surface of the metal board having the CPU chip placed thereon.

15. An integrated circuit device according to claim 2 wherein the plurality of pins are substantially in the form of a cross.

* * * * *

UNITED STATES PATENT AND TRADEMARK OFFICE
CERTIFICATE OF CORRECTION

PATENT NO.   : 6,303,989 B1
DATED        : October 16, 2001
INVENTOR(S)  : Yasuho et al.

It is certified that error appears in the above-identified patent and that said Letters Patent is hereby corrected as shown below:

<u>Title page,</u>
Item [*] Notice, delete "773" and insert -- 1001 --.

Signed and Sealed this

Eighth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,303,989 B1
DATED : October 16, 2001
INVENTOR(S) : Yasuho et al.

It is certified that error appears in the above-identified patent and that said Letters Patent is hereby corrected as shown below:

<u>Title page,</u>
Item [22], should read:
-- [22] PCT Filed: Jul. 3, 1995 --.

Signed and Sealed this

Twenty-third Day of March, 2004

JON W. DUDAS
*Acting Director of the United States Patent and Trademark Office*